United States Patent
Edwards et al.

(10) Patent No.: US 6,365,977 B1
(45) Date of Patent: Apr. 2, 2002

(54) INSULATING INTERPOSER BETWEEN TWO ELECTRONIC COMPONENTS AND PROCESS THEREOF

(75) Inventors: David L. Edwards, Poughkeepsie; Norman J. Dauerer, Hopewell Junction; Glenn G. Daves, Beacon, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/387,061

(22) Filed: Aug. 31, 1999

(51) Int. Cl.⁷ .................. H01L 23/48; H01L 23/52; H01L 29/40
(52) U.S. Cl. .................. 257/780; 757/781; 757/728
(58) Field of Search ................. 757/780, 781, 757/783, 778

(56) References Cited

U.S. PATENT DOCUMENTS

| | | |
|---|---|---|
| 5,111,279 A | 5/1992 | Pasch et al. |
| 5,136,359 A | 8/1992 | Takayama et al. |
| 5,168,346 A | 12/1992 | Pasch et al. |
| 5,237,269 A | 8/1993 | Aimi et al. |
| 5,347,162 A | 9/1994 | Pasch |
| 5,438,223 A | 8/1995 | Higashi et al. |
| 5,487,999 A | 1/1996 | Farnworth |
| 5,494,856 A | 2/1996 | Beaumont et al. |
| 5,517,125 A | 5/1996 | Posedel et al. |
| 5,532,612 A | 7/1996 | Liang |
| 5,569,963 A | 10/1996 | Rostoker er al. |
| 5,703,406 A * | 12/1997 | Kang |
| 6,040,630 A * | 3/2000 | Panchou |
| 6,091,141 A * | 7/2000 | Heo |
| 6,093,971 A * | 7/2000 | Oppermann et al. |
| 6,121,682 A * | 9/2000 | Kim |
| 6,177,731 B1 * | 1/2001 | Ishida et al. |
| 6,194,781 B1 * | 2/2001 | Ikegami |

* cited by examiner

Primary Examiner—Sheila V. Clark
(74) Attorney, Agent, or Firm—Margaret A. Pepper

(57) ABSTRACT

The present invention relates generally to a new structure and a method for reducing the cost of producing known good die (KGD). More particularly, the invention encompasses a structure and a method that uses a substrate having solder wettable pads, a chip with attached solder balls, and a thin non-conductive interposer that is assembled between the chip and the substrate. The interposer reduces the cross section of the solder connections from the chip to the substrate where the solder passes through (the holes in) the interposer. This reduced cross-sectional area of the solder connection creates a weak point which allows the chip to be easily sheared off of the substrate after a burn-in and test process. The preferred chips for this invention are flip chips.

18 Claims, 2 Drawing Sheets

INSULATING INTERPOSER BETWEEN TWO ELECTRONIC COMPONENTS AND PROCESS THEREOF

FIELD OF THE INVENTION

The present invention relates generally to a new structure and a method for reducing the cost of producing known good die (KGD). More particularly, the invention encompasses a structure and a method that uses a substrate having solder wettable pads, a chip with attached solder balls, and a thin non-conductive interposer that is assembled between the chip and the substrate. The interposer reduces the cross section of the solder connections from the chip to the substrate where the solder passes through (the holes in) the interposer. This reduced cross-sectional area of the solder connection creates a weak point which allows the chip to be easily sheared off of the substrate after a burn-in and test process. The preferred chips for this invention are flip chips.

BACKGROUND OF THE INVENTION

Semiconductor devices are becoming smaller and more dense with the evolution of new technology. However, increases in circuit density produce a corresponding emphasis on overall chip packaging strategies in order to remain competitive. Chip and chip substrate manufacturers are therefore constantly being challenged to improve the quality of their products by identifying and eliminating problems, reducing package size and weight, decreasing package costs, providing improved thermal efficiencies and producing better and more advanced chips. Whereas significant improvements are being made to eliminate systematic problems by reducing process variability, process improvements alone are not sufficient to eliminate all the problems which effect both performance and reliability.

One way to improve device density and improve performance is to use multi-chip modules (MCMs). Certain chip defects are not detectable until the chip is mounted onto a substrate. Other chips have latent defects which appear early in use. These latent defects often have their lives accelerated, and are caused to fail during manufacturing processes, via various burn-in operations. In either case, once a defective chip has been detected, expensive rework processes are required to replace the defective component and avoid the loss of the other devices on the module. If the module has many chips or if the chips have low yields, the required rework steps could be numerous, which could be cost prohibitive, and possibly degrade the reliability of the substrate.

One way to reduce the cost of assembling MCMs is to use known good die (KGD). Therefore, the availability of KGD is an important factor in bringing MCMs into the marketplace.

Traditional methods of producing KGD involves joining chips temporarily to special substrates. However, these processes are rather expensive as they involve the use of expensive plating operations. The temporarily attached chip on the substrate is then subjected to burn-in and test. Having survived these processes the chips are then sheared from the burn-in and test substrates and remounted (permanently) onto a product substrate. Therefore, a reduction in the cost of temporary chip attach (TCA) substrates reduces the cost of KGD, which further allows the cost competitiveness of MCMs in the marketplace.

One way to reduce the cost of TCA substrates, KGD, and MCMs is to develop a structure and a method for producing KGD that uses conventional single chip module (SCM) substrates, but does not require the use of expensive plating processes. One way to eliminate the need for these plating processes is to invent an interposer or a separator that can be assembled between a standard flip chip and a standard substrate, where the interposer or separator significantly reduces the cross sectional area of the flip chip solder connections, so that the connections may be easily sheared after a burn-in and test process.

U.S. Pat. No. 5,111,279 (Pasch), U.S. Pat. No. 5,168,346 (Pasch), U.S. Pat. No. 5,347,162 (Pasch) and U.S. Pat. No. 5,569,963 (Rostoker), all related to each other and assigned to LSI Logic Corporation, disclose a preformed planar structure that is interposed between the chip(s) and the substrate in a flip-chip structure. This type of a structure establishes a minimum gap between the chip(s) and the substrate. These patents also disclose that the interposer could be dissolvable. Also disclosed is that the through holes may be angled so that the interposer acts as a pitch spreader or adapter.

U.S. Pat. No. 5,237,269 (Aimi) assigned to International Business Machines Corporation, the disclosure of which is incorporated herein by reference, discloses connections between circuit chips and a temporary carrier for use in burn-in tests, in which frangible connections are made between contact points of a reusable carrier and a chip to be tested. After the burn-in test, shear force is imparted such that the frangible connections are broken without causing damage to the chip or the carrier. Also disclosed is the fact that the solder balls could be reflowed to reshape them for subsequent use.

U.S. Pat. No. 5,494,856 (Beaumont) assigned to International Business Machines Corporation, the disclosure of which is incorporated herein by reference, discloses an apparatus and method for creating detachable solder connections between two surfaces which connections are relatively weak and thus can be readily fractured for separating the surfaces. Basically, the surface of the pad on the carrier has a matrix of solder wettable and solder non-wettable areas, and once the solder balls on the chip are attached to the treated pads the electrical contacts are made, and the chip can be readily removed after the test.

Therefore, there is a need for a low cost interposer that can be used with conventional substrates, to establish weak solder connections to flip chips that can easily be sheared after burn-in and/or test.

PURPOSES AND SUMMARY OF THE INVENTION

The invention is a novel method and a structure for temporarily joining one electrical component to another electrical component with an interposer or separator in-between, wherein the interposer/separator provides a substantially reduced electrical contact area where the electrical connection passes through (the holes in) the interposer/separator. This reduced cross-sectional area of the electrical connection creates a weak point which allows one of the electrical component to be easily sheared off of the other electrical component after a burn-in and test process.

Therefore, one purpose of this invention is to provide a structure and a method that will provide a reduced electrical and physical contact area between two electrical components.

Another purpose of this invention is to provide a low cost assembly for the generation of KGD.

Still another purpose of this invention is to generate solder connections that are strong enough to survive burn-in and test operations.

Yet another purpose of this invention is to generate solder connections that are weak enough that they are easily sheared after the completion of the burn-in and test operations.

Still another purpose of this invention is to be able to use and re-use a product-like substrate in the production of KGD.

Yet another purpose of this invention is to provide a low cost interposer to eliminate the need for expensive substrate plating processes.

Therefore, in one aspect this invention comprises an insulative separator having at least one hole to provide at least one nipple-like electrical contact between two electrical components.

In another aspect this invention comprises a structure for temporarily attaching at least one chip to a substrate comprising:

(a) a chip having at least one solder ball, (b) a substrate having at least one solder wettable pad, said pad corresponds to said solder ball on said chip, and (c) at least one insulating interposer having at least one through hole, wherein said hole reduces the physical surface connection between said solder ball and said pad.

In yet another aspect this invention comprises a method of joining two electrical components with a separator in-between comprising.

(a) placing a separator having at least one hole on a first electrical component, such that at least a portion of said hole exposes at least a portion of said first electrical component, (b) placing a second electrical component, such that at least a portion of said second electrical component is in registration contact with at least a portion of said hole and forms an assembly, (c) heating said assembly, such that at least a portion of said first electrical component and at least a portion of said second electrical component form at least one electrical connection through said hole.

In still yet another aspect this invention comprises a method for temporarily attaching at least one chip to a substrate comprising:

(a) placing at least one interposer having at least one hole over a substrate having at least one solder wettable pad, such that at least a portion of said hole covers at least a portion of said pad, (b) placing at least one chip having at least one solder ball over said interposer, such that at least a portion of said solder ball is in registration contact with said hole, and forms an assembly where said solder ball, said hole and said solder wettable pad are aligned, and (c) heating said assembly to reflow said solder ball to mechanically and electrically secure at least a portion of said solder ball to said pad through said hole in said interposer.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

IBM's multilayered ceramic (MLC) electronic packages are among the most technically advanced electronic packages in the industry; however, some of the most integrated packages can also be rather expensive. This invention describes one way to reduce the cost of MCMs without any loss or degradation of their performance. Packaging methods which reduce costs advantageously increase the availability of such electronic packages in the marketplace. As a person skilled in the art knows, the availability of low cost KGD affects the demand for MCMs in the marketplace.

Figure 1A:
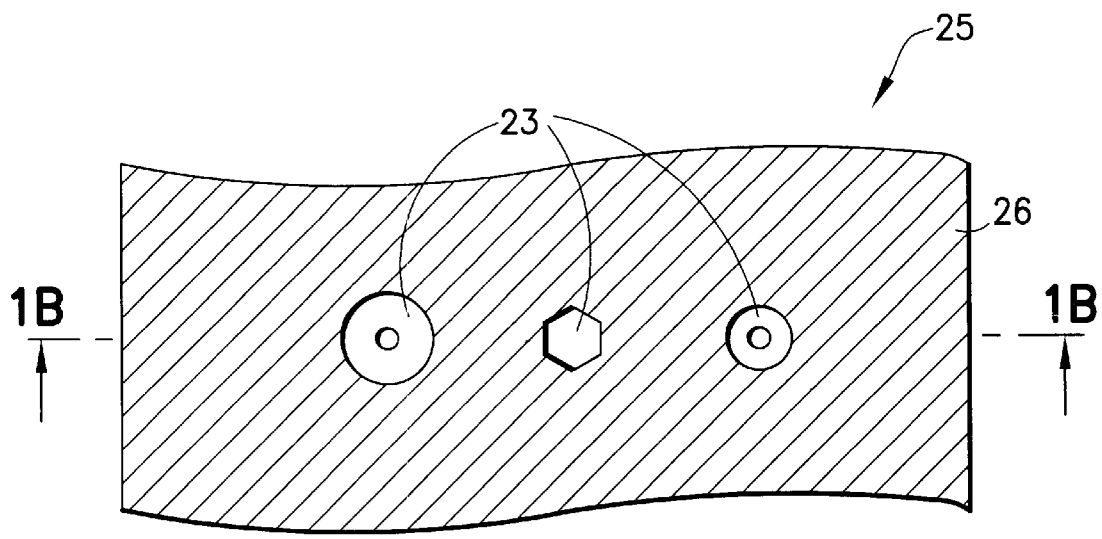
FIG. 1A is a top view of a preferred interposer of this invention.
Figure 1B:
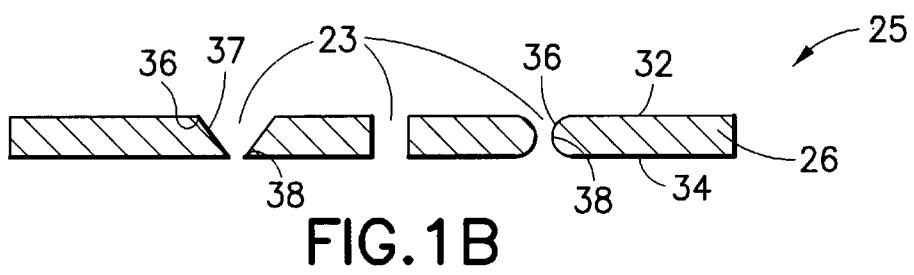
FIG. 1B is a cross-sectional view of a preferred interposer of this invention.

FIG. 1A is a top view of a preferred interposer or separator 25 of this invention, and FIG. 1B is a cross-sectional view of interposer 25. In the preferred embodiment, the interposer 25 is made from a non-conductive material 26 having a first or upper surface 32, and a second or lower surface 34, with at least one hole or opening 23. The hole 23 could have a taper 37. The hole 23 also could have diameter 36 or 38, where the diameter 36 and 38 could be the same or could be different.

Figure 2:
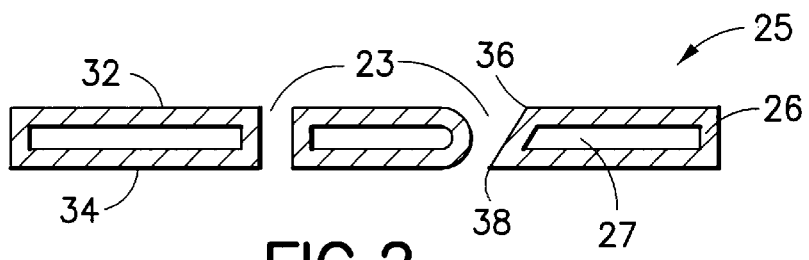
FIG. 2 is a cross-sectional view of an alternative embodiment of this invention.

FIG. 2 is a cross-sectional view of an alternative embodiment of this invention. FIG. 2 shows that the separator 25 can be made from at least one electrically conductive material 27, but is coated or plated with at least one non-conductive material 26 so as to render it effectively non-conductive. In addition to the plating or other coating being non-conductive, the material 26 preferably is something that will not contaminate any solder. For example, chromium material could contaminate solder.

For some applications, it is preferred that the hole 23 is tapered, such that the diameter 36 at the first surface 32 of the hole 23 is greater than the diameter 38 at the second surface 34 of the hole 23. Therefore, it would be preferred that the second surface 34 always comes in contact with a substrate, as discussed elsewhere, so that the weakest point in the solder joint is as close to the substrate as possible.

Similarly, the hole or opening 23 could have a uniform diameter or a varying diameter. For example, hole 23 with a uniform diameter would result in cylindrical walls, while hole 23 with a non-uniform diameter could have an hourglass like shape or a tapered wall, to name a few.

Figure 3:
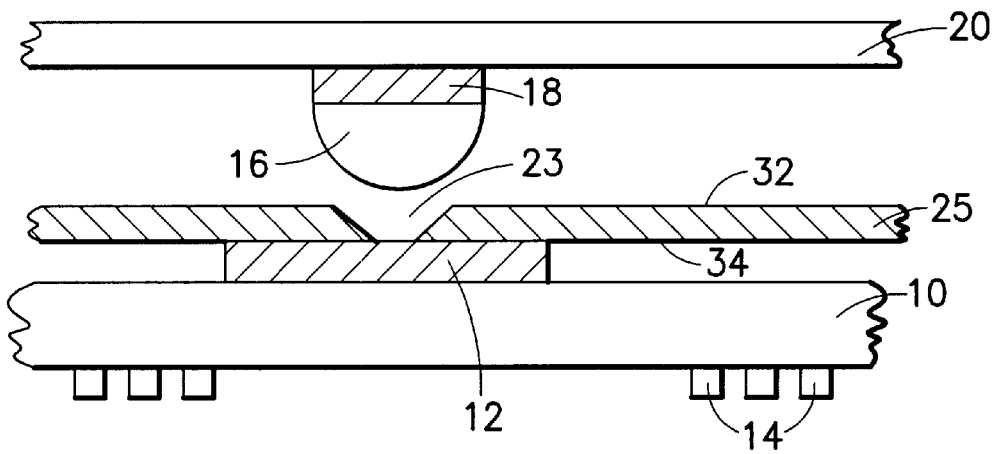
FIG. 3 is a cross-sectional view of the preferred interposer of this invention showing the interposer separating a chip from a substrate.

FIG. 3 is a cross-sectional view of the preferred interposer 25 of this invention showing the interposer 25 separating a chip 20 from a substrate 10. The flip chip substrate 10 has at least one solder wettable pad 12. The pad 12 could be plated with at least one solder wettable metallurgy, such as nickel or gold. The substrate 10 may have at least one I/O means 14, such as PGA (pin grid array), LGA (land grid array), BGA (ball grid array), or CGA (column grid array). The chip 20 has at least one solder wettable pad 18. The pad 18 typically has at least one solder ball 16 secured thereto. The solder ball 16 could be deposited and/or formed on the pad 18 by any of several means known in the art. For most applications, it is preferred that the second surface 34 of the interposer 25 is placed over the substrate 10, such that at least a portion of the opening 23 covers at least a portion of the solder wettable pad 12.

Figure 4:
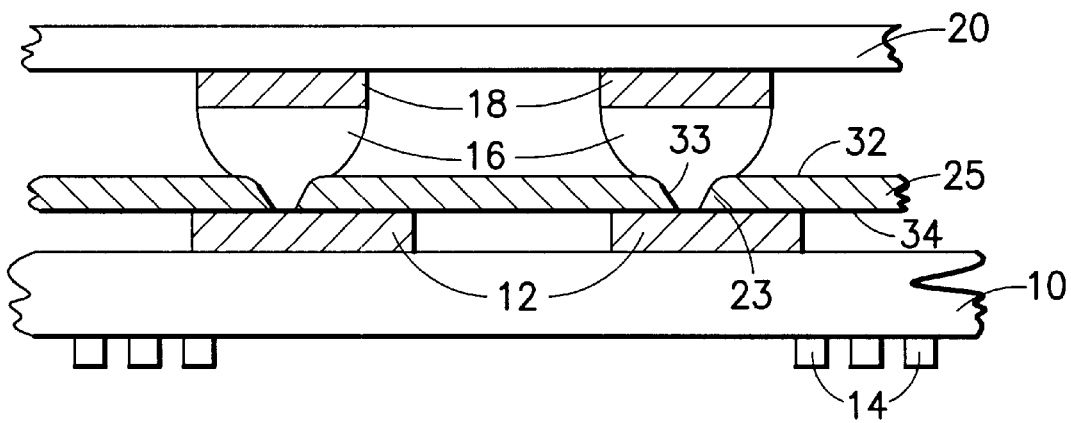
FIG. 4 is a cross-sectional view showing the interposer of this invention providing a reduced contact area between the chip and the substrate.

FIG. 4 is a cross-sectional view showing the inventive interposer 25, providing a reduced contact area 33 between the chip 20 and the substrate 10. The substrate pads 12 and/or solder ball 16 are typically fluxed prior to the placing of the chip 20 onto the substrate 10, where the pad 12 corresponds to and contacts solder ball 16. As stated earlier, the interposer 25 is preferably placed over the substrate 10 such that at least a portion of the hole 23 is over at least a portion of the pad 12, and the hole 23 exposes at least a portion of the top surface of the pad 12. The interposer 25 allows the connection of the solder ball 16 to the pad 12, while separating the chip 20 from the substrate 10.

This assembly comprising the substrate 10, the interposer 25, and the chip 20 is then run through a thermal environment, such as a furnace, to reflow the solder ball 16, and to attach a portion of the solder ball 16 to a portion of the pad 12. Upon reflowing, a portion of the solder ball 16 attaches itself through the hole 23 to a portion of the pad 12, creating a nipple like area 33 in the solder ball 16. As one can clearly see in FIG. 4, the area 33 of the solder ball 16 is greatly reduced where it passes through the hole 23 to connect to the substrate 10 at solder wettable pad 12. By using the interposer of this invention, a product substrate can be used as a temporary chip attach substrate.

As stated earlier, during reflow, the solder ball 16 wets and attaches itself to the pad 12, but the hole 23 in the interposer 25 reduces the cross-sectional area, causing a weaker joint between the solder ball 16 and the pad 12. It can be clearly seen in FIG. 4 that the cross sectional area of the solder connection joint is greatly reduced where it passes through the hole 23 creating a weak joint 33, which can be easily sheared after additional burn-in and test operations. However, it is preferred that the solder joint 33 is sufficiently strong to survive the burn-in and test processes, but is sufficiently weak so that it can be easily sheared afterward. The chip 20, with sheared solder ball 16, may be reflowed to restore the solder balls to spherical shape, so that they can have high yields when later reattached to a product substrate, as a rounded solder ball 16 shown clearly in FIG. 3.

This invention thus allows for a chip test and burn-in, while allowing for the subsequent generation of a strong solder connection that can last many years of use in various product applications.

The method and structure of this invention also reduces the cost of producing KGD, using the new thin insulating interposer. It is preferred that the interposer be thin enough to be placed between typical flip chips and typical product substrates. Of course the interposer surface has to be an insulator, so that it does not create electrical shorts between flip chip solder connections. The substrate typically has solder wettable pads, which correspond to an array of solder balls on the chip. The invented interposer has an array of holes that must include, but is not limited to the solder ball array. The interposer rests on the substrate and typically has tapered holes, where the narrower end of the holes is against the substrate. The chip may then be placed on top of the substrate/interposer assembly and reflowed. During reflow, some of the solder material from the solder balls passes through the holes in the interposer to wet and attach to the pads on the substrate. Where the solder balls pass though the interposer to the substrate, the cross sectional area is greatly reduced creating a much weaker, and less reliable joint than would otherwise be achieved without the interposer.

It is preferred that the interposer is thin and has an array of holes that correspond to the pads on the substrate, and the balls on the chip. However, the interposer could have more holes than there are solder balls on the chip and/or pads on the substrate. In this manner, unique chip footprints do not require unique interposer hole arrays, as long as the unique chip array is a subset of the interposer hole array. One example of this is a depopulated solder ball array on the chip, and a full array of holes in the interposer. Another example could be a full array of solder balls on a flip chip, with an interposer with an even greater full array of holes, where both arrays have the same pitch.

It is also preferred that the interposer surface is made from material(s) that are both thermally stable and electrically insulating, such as a polyimide layer or film, or Kapton.

The holes in the interposer can be made using any of several means known in the art, such as etching, drilling, laser cutting, casting, or molding.

It should be understood that the interposer could be placed on the substrate, but not attached it. However, the interposer could be attached to the substrate using at least an adhesive. For some applications one could use an interposer that is dissolvable after use. The interposer could be made from a material that is disposable after a single use, or it could be made from a material that is reusable one or more times.

It is preferred that the holes in the interposer are tapered. The preferred taper of the hole is about 45 degrees. It is preferred that the minimum diameter of the tapered hole is about 0.001 inches (1 mil). However, for some applications it might be preferred that the interposer be very thin. For some applications the interposer could be as thin as about 3 mils, and preferably about 1 mil. The shape of the hole 23 could be selected when viewed from a cross-section from a group comprising a rectangular shape, a tapered shape, or hour-glass shape, or the shape of the hole 23 could be selected when viewed from the top from a group comprising a circular shape, or a polygonal shape.

As one can appreciate, the invention uses an interposer that can be used with less expensive TCA vehicles for the creation of KGD. One advantage of this invention is that the TCA vehicle may be made using conventional fabrication processes, eliminating the need for expensive plating processes. Another advantage of this invention is that a conventional flip chip join process may be used to establish the required electrical connections. These joints can easily be cold sheared later because the solder ball cross sectional area is greatly reduced where it passes through the interposer. Furthermore, many different solder ball arrays can be accommodated by interposer of this invention with a full array of holes.

It has been found that for most applications the interposer of this invention reduces the solder joint minimum cross sectional area between about 15× to about 25×.

For some application the interposer could have more holes than there are solder balls on the chip, and the solder ball array on the chip could be a subset of the interposer hole array. The interposer/separator could have an array of holes that are compatible with more than one chip footprint. However, a chip foot print could be a subset of the arrays of holes in the interposer. Similarly, for some applications a single interposer could be used simultaneously for multiple chip sites.

As stated earlier, the electrical connections between the chip and the substrate going through the opening in the interposer/separator should be strong enough for the burn-in and/or test. However, these electrical connections should be weak enough to be easily sheared.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A structure for temporarily attaching at least one chip to a substrate, wherein said chip has at least one solder ball and said substrate has at least one solder-wettable pad corresponding to said at least one solder ball, comprising:

at least one insulating interposer disposed between said chip and said substrate and having at least one through hole corresponding to said at least one solder ball, wherein said hole has a diameter which is smaller than said solder ball and said solder-wettable pad.

2. The structure of claim 1, wherein said interposer is made from at least one polyimide film.

3. The structure of claim 1, wherein said interposer is made from Kapton.

4. The structure of claim 1, wherein said interposer comprises at least one electrically conductive material which is coated or plated with at least one non-conductive material so as to render said interposer effectively non-conductive.

5. The structure of claim 1, wherein said hole has a shape, when viewed from a cross-section, which is selected from a group consisting of a rectangular shape, a tapered shape and hour-glass shape.

6. The structure of claim 1, wherein said hole has a shape, when viewed from the top, selected from a group consisting of a circular shape and a polygonal shape.

7. The structure of claim 1, wherein said hole creates a nipple-like electrical connection between said chip and substrate, upon reflow of said solder ball.

8. The structure of claim 1, wherein said hole has a diameter less than about two mils.

9. The structure of claim 1, wherein said hole has a first diameter at a first surface of said interposer and a second diameter at a second surface of said interposer, and wherein said first diameter is equal to said second diameter.

10. The structure of claim 1, wherein said hole has a first diameter at a first surface of said interposer and a second diameter at a second surface of said interposer, and wherein said first diameter is greater than said second diameter.

11. The structure of claim 1, wherein said interposer is dissolvable.

12. The structure of claim 1, wherein at least a portion of said hole has a taper of about 45 degrees.

13. The structure of claim 1, wherein said hole has a diameter of about one mil.

14. The structure of claim 1, wherein said second diameter is about one mil.

15. The structure of claim 1, wherein said interposer has a thickness of about 3 mils.

16. The structure of claim 1, wherein said interposer has a thickness of about 1 mil.

17. The structure of claim 1, wherein at least a portion of said interposer is secured to said substrate.

18. The structure of claim 1, wherein at least a portion of said interposer is secured to said chip.

* * * * *